(12) United States Patent
Laughlin et al.

(10) Patent No.: US 9,933,470 B2
(45) Date of Patent: Apr. 3, 2018

(54) ENERGY SPECTRUM VISUALIZATION SYSTEM

(71) Applicant: THE BOEING COMPANY, Huntington Beach, CA (US)

(72) Inventors: Brian Dale Laughlin, Wichita, KS (US); William David Kelsey, Issaquah, WA (US)

(73) Assignee: THE BOEING COMPANY, Huntington Beach, CA (US)

( * ) Notice: Subject to any disclaimer, the term of this patent is extended or adjusted under 35 U.S.C. 154(b) by 168 days.

(21) Appl. No.: 14/841,337

(22) Filed: Aug. 31, 2015

(65) Prior Publication Data

US 2017/0061690 A1 Mar. 2, 2017

(51) Int. Cl.
*G09G 5/00* (2006.01)
*G01R 29/08* (2006.01)

(52) U.S. Cl.
CPC ................. *G01R 29/0892* (2013.01)

(58) Field of Classification Search
None
See application file for complete search history.

(56) References Cited

U.S. PATENT DOCUMENTS

| | | | | |
|---|---|---|---|---|
| 2012/0147040 A1* | 6/2012 | Yun | ....................... | G06T 19/006 345/633 |
| 2012/0176376 A1* | 7/2012 | Kim | ..................... | H04W 4/026 345/419 |
| 2013/0176336 A1* | 7/2013 | Hannula | .............. | A61B 5/0042 345/633 |
| 2013/0290225 A1* | 10/2013 | Kamath | ............. | G06K 9/00127 706/12 |
| 2014/0136089 A1* | 5/2014 | Hranac | ................ | G08G 1/0962 701/118 |
| 2014/0168266 A1* | 6/2014 | Kimura | .............. | G02B 27/0172 345/633 |
| 2015/0234454 A1* | 8/2015 | Kurz | ....................... | G06F 3/011 345/156 |
| 2015/0294506 A1* | 10/2015 | Bare | ..................... | G06T 19/006 345/633 |
| 2016/0147492 A1* | 5/2016 | Fugate | .................. | G06F 3/1423 345/633 |
| 2017/0039767 A1* | 2/2017 | Lanier | .................. | G02B 27/017 |
| 2017/0228862 A1* | 8/2017 | Rothberg | ............. | G06T 7/0012 |

\* cited by examiner

*Primary Examiner* — David H Chu
(74) *Attorney, Agent, or Firm* — Womble Bond Dickinson (US) LLP

(57) ABSTRACT

An environmental visualization system is provided for visualization of an energy spectrum. The environmental visualization system may include a front-end system configured to receive input from sensors configured to measure emissions within an environment of a user, and provide a corresponding sensed input that includes a at least one energy frequency of the emissions and that indicates a spatial-temporal distribution of the emissions within the environment. The system may also include an energy spectrum system configured to generate from the sensed input, a multidimensional layout that depicts the at least one energy frequency and spatial-temporal distribution of the emissions from which a significance of the emissions is identifiable, in which the front-end system may be configured to output the multidimensional layout for display by a display device.

18 Claims, 11 Drawing Sheets

ENERGY SPECTRUM VISUALIZATION SYSTEM

TECHNOLOGICAL FIELD

The present disclosure relates generally to interactive environmental visualization and, in particular, to energy spectrum visualization through an interface integrated within a user's physical, real-world environment to support engineering activity.

BACKGROUND

Virtual reality is an approach to human-machine interaction and environmental visualization in which an "immersive" virtual (or unreal) environment is created to provide a user with the sense of being totally immersed in an artificial, three-dimensional (3D) world that is generated by computer software. A related, more recent approach to human-machine interaction and environmental visualization is augmented reality in which a view of a user's physical, real-world environment may be augmented with virtual elements. Virtual reality and augmented reality are often implemented through the use of display hardware such as head-mounted systems, computer screens and the like. But past approaches to implement virtual and augmented reality through such display devices have met with varied, but suboptimal success.

For example, in the context of energy emissions, many forms of energy emissions are invisible or otherwise undetectable in meaningful ways for human interaction and assessment. As a result, the source of problems related to these emissions may be subsequently difficult to diagnose in real-time during an event. In particular, the energy emissions may be unrecognized or under evaluated as contributing factors to the related problems, thus leaving the problems unsolved. Exemplary problems related to undetected energy emissions may include frequency collisions amongst computing devices in an environment (e.g., frequency collisions between cordless phones in the 2.4 GHz band and microwave signals (particularly poorly shielded microwaves which can emit signals across the 2.4 GHz band), radio frequency identification (RFID) readers (e.g. UHF, operating in the 860 MHz-960 MHz frequencies) and flight-ready aircraft components having potential energy emissions within an effected energy spectrum such as Auxiliary Power Units (APUs)), detecting and correlating physical fatigue (e.g., detecting abhorrent vibrations, frequencies approaching component resonance or harmonics thereof), wireless signal characterization (e.g., investigating areas of weak and strong signal strength/availability), and the like. Traditionally, adequate investigation of similar types of radiation emissions requires an array of equipment, and an arduous and lengthy process, as the presence of radiation itself could not be seen directly, but only extrapolated, based on interpretations of an array of gauge readings and post-processing analysis. The exemplary problems may be more easily identified through improved environmental visualization systems.

In another example, within the context of computing architecture, the process of troubleshooting within a computing architecture system may generally rely on manual evaluations, as a user attempts to understand the process flow of data through the system. In one instance, an employee may be required to trace code, monitor network packets, and the like to ascertain the flow of data throughout a network. As a result, the current methods may be highly cumbersome as there is no way to directly visualize signals traveling through a network, program, or between devices during the troubleshooting process.

Therefore, it may be desirable to have a system and method that improves on existing approaches to environmental visualization.

BRIEF SUMMARY

Example implementations of the present disclosure are directed to an improved system, method and computer-readable storage medium for visualization of an energy spectrum. The present disclosure includes, without limitation, the following example implementations.

In some example implementations, a method is provided for visualization of an energy spectrum. The method may comprise receiving input from sensors configured to measure emissions including electric, magnetic or electromagnetic fields within an environment of a user. The method may also comprise providing a corresponding sensed input that includes at least one energy frequency of the emissions and that indicates a spatial-temporal distribution of the emissions within the environment. The method may also comprise generating from the sensed input, a multidimensional layout that depicts the at least one energy frequency and spatial-temporal distribution of the emissions from which a significance of the emissions is identifiable. The method may also comprise receiving and outputting the multidimensional layout for display by a display device.

In some example implementations of the method of the preceding or any subsequent example implementation, or any combination thereof, outputting the multidimensional layout for display by a display device includes generating or enabling a live or direct view of the environment, augmented by the multidimensional layout.

In some example implementations of the method of any preceding or any subsequent example implementation, or any combination thereof, receiving the multidimensional layout includes recording in real-time the sensed input from which the multidimensional layout is generated and thereby producing a recorded sensed input, and generating from the recorded sensed input, a recorded multidimensional layout. And outputting the multidimensional layout includes outputting the recorded multidimensional layout for display by the display device to enable playback of the multidimensional layout in real-time or over a predetermined period of time.

In some example implementations of the method of any preceding or any subsequent example implementation, or any combination thereof, outputting the recorded multidimensional layout includes generating or enabling a direct view of the environment, augmented by the recorded multidimensional layout.

In some example implementations of the method of any preceding or any subsequent example implementation, or any combination thereof, the fields include two or more different types of fields, and generating the multidimensional layout includes generating the multidimensional layout that simultaneously includes the two or more different types of fields, and in which each of the two or more different types of fields is represented using at least one of a distinct visual, tactile or audible property, the distinct visual, tactile or audible property including at least one of a color, shape, size, opacity, speed, direction and pulsing.

In some example implementations of the method of any preceding or any subsequent example implementation, or any combination thereof, generating the multidimensional layout includes receiving a user preference for the distinct visual, tactile or audible property used to represent each of the two or more different types of fields.

In some example implementations of the method of any preceding or any subsequent example implementation, or any combination thereof, the method further comprises receiving signals communicated and carrying messages between source and destination network nodes separate and distinct from the system in a communication network composed of a plurality of network nodes within the environment of the user; generating data input for the signals that indicates the source and destination network nodes; and generating from the data input, a second multidimensional layout that depicts the communication network, including the source and destination network nodes and signals communicated therebetween, in which receiving the multidimensional layout includes further receiving the second multidimensional layout, and outputting the multidimensional layout includes producing from the multidimensional layout and second multidimensional layout a combined multidimensional layout that simultaneously depicts the communication network and the at least one energy frequency and spatial distribution of the emissions, and outputting the combined multidimensional layout.

In some example implementations, an environmental visualization system is provided. The system may include implementation of subsystems, such as a front-end system and energy spectrum system, configured to perform steps of the method.

In some example implementations, a computer-readable storage medium is provided for visualization of an energy spectrum. The computer-readable storage medium is non-transitory and has computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
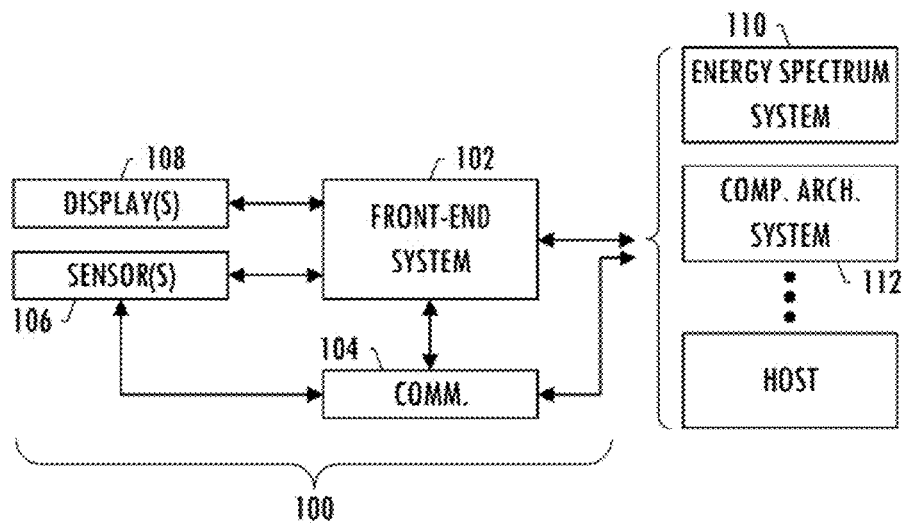
FIG. 1 is an illustration of an environmental visualization system in accordance with an example implementation.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to an environmental visualization system for providing a real-time visualization of non-visible signals within a user's environment. Example implementations will be primarily described in conjunction with energy spectrum and computing architecture applications. The environmental visualization system may be a more particular example of the system described by U.S. patent application Ser. No. 13/903,242, entitled: Ubiquitous Natural User System, filed May 28, 2013, the content of which is incorporated by reference in its entirety.

FIG. 1 illustrates an environmental visualization system 100 according to example implementations of the present disclosure, which may be simply referred to as the "system" herein. The system may include, for example, a front-end system 102 connected or otherwise coupled to one or more interfaces for transmitting, receiving and/or outputting information. The interfaces may include one or more communications interfaces 104, sensors 106 and/or user interfaces. The communications interface may be configured to transmit and/or receive information, such as to and/or from other elements of the system, one or more resource host systems and the like.

The communications interface 104 may be configured to transmit and/or receive information by physical (wired), and/or wireless communications links such as optical communication links. These wireless communication links in particular may be configured to implement any of a number of different radio access technologies such as any of a number of 3GPP or 4GPP radio access technologies, UMTS UTRA, GSM radio access technologies, CDMA 2000 radio access technologies, WLANs (e.g., IEEE 802.--, e.g., 802.11a, 802.11b, 802.11g, 802.11n), WiMAX, IEEE 802.16, wireless PANs (WPANs) (e.g., IEEE 802.15, Bluetooth®, low power versions of Bluetooth®, IrDA, UWB, Wibree, Zigbee®), near-field communication technologies, and the like.

The front-end system 102 may also be coupled to one or more sensors 106 configured to provide sensed input to the system 100. The sensors, and in some examples the communications interface 104, may generally provide input necessary for the front-end system to detect and/or recognize signals, and drive the display of a natural user interface for visualization of the user's environment. Natural user interfaces may remove extraneous devices and input modalities, and may allow geo-temporally and task salient interactions tailored to the role (or clearance level) and purview of the user.

The front-end system 102 may also be coupled to one or more user interfaces for outputting and/or inputting information, such as a display device 108, audio output device(s) such as speaker(s), headphones and the like, haptic sensor(s) configured to provide tactile feedback such as forces, vibrations or motions. The display device may be configured to present or otherwise display information to a user, and in some examples may include the display device of a wearable (e.g., head-mounted) or portable personal display system. Examples of suitable personal display systems may include private, private-shared (linked private) or public personal display systems such as those provided in the form of eyeglasses, safety goggles, contact lenses and the like, image projectors, video projectors, any of a number of other active or passive display systems, laser pointers and the like. In other examples, the display device may include a more conventional display device such as a liquid crystal display (LCD), light-emitting diode display (LED), plasma display panel (PDP) and the like, which may or may not take the form of a personal display system (e.g., smartphone, tablet computer).

The user interfaces may also include one or more user input interfaces. These user input interfaces may be wired or wireless, and may be configured to receive information from a user into the system 100, such as for processing, storage and/or display. Suitable examples of user input interfaces include a microphone, image or video capture device, keyboard or keypad, joystick, touch-sensitive surface (separate from or integrated into a touchscreen), biometric sensor and the like. Similar to the communications interface, in some examples, a user input interface may function as a sensor for providing information directly from a user.

As suggested above, the system 100 of example implementations may include and/or be configured to communicate with one or more resource host systems, which may be configured to host electronic resources. Some examples of host systems may be remote from the system such as across one or more networks, while other examples of host systems may be local to the system. The electronic resources may vary depending on application of the system, although examples of suitable electronic resources may generally include software-based systems. In some examples, the resource host system may include an appropriate storage accessible by an electronic resource, such as file storage, database storage, cloud storage and the like. As shown, two examples of suitable resource host systems include an energy spectrum system 110, and a computing architecture system 112.

The resource host system(s) are shown separate from the system 100, but in various examples, the system may include one or more resource host systems. Thus, in some examples, the system may include either or both of the energy spectrum analysis system 110 or computing architecture system 112. Likewise, while the sensors 106 and display device 108 are shown as part of the system, one or more sensors and/or display devices may be separate from but in communication with the system, such as in the case of one or more off-board sensors.

Figure 2:
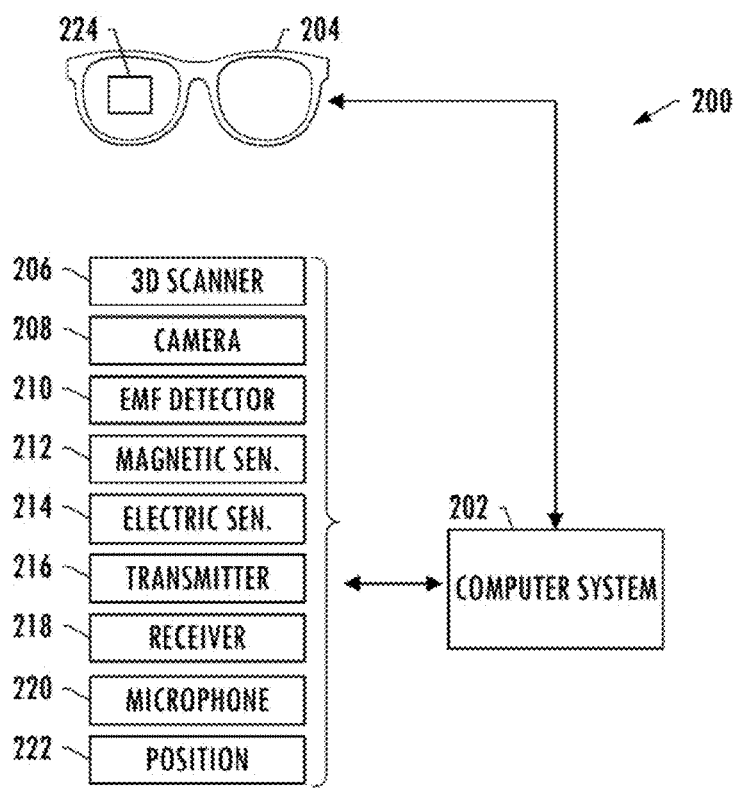
FIG. 2 is an illustration of one example implementation of the environmental visualization system in the form of an augmented reality system.

FIG. 2 is an illustration of an environmental visualization system 200 (e.g., environment visualization system 100) in the form of an augmented reality system. As shown, the system may include a computer system 202, which in some examples may be configured to implement the front-end system 102 and communication interface 104 of the environmental visualization system 100 of FIG. 1. In some examples, the computer system may comprise, include or be embodied in a portable, hardware-based electronic device such as a smartphone, tablet computer and the like. The computer system may be coupled (by wire or wirelessly) to one or more wearable (e.g., head-mounted) or handheld personal display systems. In some examples, the personal display system may take the form of augmented reality (AR) eyeglasses, safety goggles, contact lenses and the like (generally AR glasses 204), which may be wearable by a user in an environment. In some examples, the system may be integrated into the AR glasses.

The computer system 202 and/or AR glasses 204 (or other personal display system) may be equipped with or coupled (by wire or wirelessly) to one or more sensors (e.g., sensors 106) configured to provide sensed input to the computer system. As suggested above, for example, the sensors may include an environmental-condition sensor such as a physical field detector 226 configured to sense the user's environment and provide measurements of signals emitted by electronic devices within the environment. These measurements may be used for a number of different purposes, such as to generate a visualization of the signals within of the user's environment.

The sensors may also include one or more cameras 208 that may be configured as a user action-tracking sensor and/or environmental-condition sensor. The camera(s) may be configured to capture images or videos of the user and/or their physical, real-world environment; and in some instances, the camera(s) may thereby capture gestures of the user. In some examples, the sensors may include other user action-tracking sensors that in some instances may be configured to capture gestures of the user, according to any of a number of suitable gesture recognition techniques.

The sensors may also include physical field detectors configured to sense signals within the user's environment. Examples of suitable sensors include one or more radiation sensors (e.g., electromagnetic field (EMF) detectors 210, magnetic field sensors 212, electric field sensors 214, and the like), transmitters 216, receivers 218, spectrum analyzers, oscilloscopes, voltage loop sensors, current loops sensors, and the like, Additionally or alternatively, for example, the sensors may include an audio sensor such as a microphone 220 configured to capture audio such as voice commands from the user. In some example implementations, the sensors may vary based upon the environment being visualized such that appropriate sensors are utilized for respective environments. The sensors may be configured to measure voltage (e.g., frequency and amplitude across time). Examples of suitable sensors may also include wiring systems (e.g., building wiring systems, plane wiring systems, and the like) that monitor reflections (e.g., amplitude and frequency). In particular, wiring such as that in a building may be utilized as an antenna—used to measure emissions (receiving) or used to communicate (transmitting). In some implementations, a differential referenced (e.g., building ground) system or conducting ground (e.g., airplane metal frame) may be utilized.

In the context of computing architecture visualization, the sensors may be or include networking instrumentation and/or packet information accessible via internet protocol (IP) traffic (e.g., TCP/IP and UDP/IP). Such information may be examined through hardware and/or software protocol analyzers (e.g., Wireshark) or directly available within the associated underlying packet and routing information. For example, correlation of an IP address to a physical system or representation of the physical systems (e.g., engineering drawings, maps, and the like may be determined using IP lookup tables, address management systems and the like for DNS correlation. IP, DNS and notional reference association (e.g., additional name/reference designators and/or other identifiers associated with a device or system of devices) may provide a cross reference lookup. In another example, tagging (e.g., part number, fiducial marker, barcode, RFID tag and the like) along with appropriate reading technology (e.g., camera and imaging processing, RIFD reader) may enable identification of assets in field of view to correlate to sensed information.

The sensors may take a number of different forms, and in some examples may be user wearable such as on the user's finger, wrist, arm, ankle, leg, waist or torso. In some examples, the AR glasses 204 may be equipped with the 3D scanner 206 and camera(s) 208, which may enable the 3D scanner and camera(s) to provide measurements and images/video from the user's viewpoint. In some examples, the camera 208 and/or microphone 220 may be configured as physiological-condition sensors configured to provide images/video and/or audio of a user. In some examples, the computer system 202 and/or AR glasses 204 may be equipped with or coupled (by wire or wirelessly) to one or more position sensors 222 configured to provide measurements of the position of the user. As indicated above, examples of suitable position sensors include those supporting GPS, inertial navigation, Wi-Fi-based positioning, RFID-based positioning or the like.

The AR glasses 204 (or other personal display system) may generate or otherwise enable a live or direct view of the user's environment. The AR glasses may also include a display device 224 (e.g., display device 108) for information from the computer system 202 (e.g., implementing system 100), such as information output by electronic resources. In this regard, the live or direct view of the environment may be augmented by information from the computer system. In some examples, the computer system or AR glasses may further include or be otherwise configured to communicate with one or more audio output devices, haptic sensors for providing audible and/or tactile feedback. This feedback may be provided in addition to or in lieu of certain visual feedback or information by the display device.

As suggested above and explained below, information from the computer system 202 may depend on sensed input from one or more sensors 206-222, some of which may be equipped by and others of which may be coupled to the AR glasses 204 and/or computer system. In one particular example, information from the computer system may vary depending on the viewpoint of the user, which may be reflected by sensed input from a sensor such as the camera 208. In some other examples, the computer system may be coupled to a plurality of AR glasses; and in these examples, information from the computer system may vary for each of the AR glasses depending on the viewpoints of their respective users.

As discussed herein, energy spectrum visualization may be implemented via an augmented reality system (e.g., environmental visualization system 200) that includes radiation sensors (e.g., electromagnetic field (EMF) detectors 210, magnetic field sensors 212, electric field sensors 214, and the like), a computing device (e.g., computing device 202), and a visualization component (e.g., AR glasses 204, and display device 224) for enabling an end user to physically visualize radiation emissions occurring within their environment. Accordingly, the front-end system 102 and energy spectrum system 110 may enable a user to visualize a variety of radiation forms (e.g., light, heat, radio waves, and the like) thereby simplifying the process of troubleshooting radiation-based issues which may include, but not be limited to, electronics signal interference, identification of radiation leaks associated with electronic devices (e.g., microwaves), and/or visualization of radio frequency collisions in an environment.

In the context of energy spectrum visualization, the front-end system 102 may include any of a number of different subsystems (each an individual system) for performing one or more functions or operations to enable visualization of an energy spectrum within a user's environment. Although not separately described herein, in some examples, the front-end system may include a number of subsystems, engines and the like, such as a sensor engine, analysis system, execution system, and/or evaluation system. Further description regarding various suitable systems, engines and the like may be found in U.S. patent application Ser. No. 13/903,242, entitled: Ubiquitous Natural User System, filed May 28, 2013.

As explained in greater detail below, the front-end system 102 may be generally configured to receive input from sensors configured to measure emissions. The emissions may include, but not be limited to electric, magnetic and/or electromagnetic fields within an environment of a user. The front-end system may also be generally configured to provide a corresponding sensed input that includes at least one energy frequency of the emissions and indicates a spatial-temporal distribution of the emissions within the environment. The front-end system may also be generally configured to provide a corresponding sensed input that includes a magnitude and signal type of the emissions. In some example implementations, a direction of the emission may also be detected based at least in part on the number of sensors, orientation of the sensors, and/or the type of emissions being sensed. The sensors may include compatible and/or registered sensors or a sensor system for which automatic tracking is available for a designated physical space and time. Accordingly, a user may enable a sensor and/or sensor system within a desired environment, and specify desired spectrums and/or frequencies for tracking within the designated physical space and time. The front-end system may gather signals (e.g., radiant emissions) from one or more sensors, and process the sensor signals according to requirement specified by the user.

The energy spectrum system 110 may be coupled to the front-end system 102 and generally configured to generate, from the sensed input, a multidimensional layout that depicts the at least one energy frequency and spatial-temporal distribution of the emissions from which a significance of the emissions is identifiable. The front-end system may then output the multidimensional layout for display by a display device 108. In addition to a multidimensional layout, the front-end system may further output audio and/or tactile/haptic feedback for presentation by a suitable device such that the environment, and more specifically, the energy spectrum may be conceptualized through visualization, audio, and/or tactile feedback. The front-end system may enable a user to select visualization options based on one or more of the signals, signal processing capabilities, visualization libraries, and/or visualization rendering capabilities of a compatible display associated with the environmental visualization system 100. As such, the multidimensional layout may be rendered based at least in part on signal inputs, signal processing, and/or user interaction with the system.

In some example implementations, the emissions may include two or more different types of fields. For example, the emissions may include both an electric and a magnetic field. In such an implementation, the energy spectrum analysis system 110 may be configured to generate a multidimensional layout that simultaneously includes the two or more different types of fields, in which each of the two or more different types of fields is represented using a distinct visual, tactile or audible property.

Accordingly, a user may visually differentiate, amongst multiple physical field types and/or intensities as a result of transforming the invisible radiation associated with the emissions into a variety of objects in a visual field. The representative objects may differentiate emissions in a number of ways including, but not limited to different colors, color intensity, patterns, opacity or transparency, pulsing of the object, size of the object, movement of the object, location of associated emissions, trajectory of associated emissions, duration of associated emissions, intensity and/or strength of associated emissions, consistency of emissions, and the like.

In such an implementation, the front-end system 102 may be configured to receive a user preference for the distinct visual, tactile or audible property used to represent each of the two or more different types of fields in which the distinct visual, tactile or audible property may include at least one of a color, shape, opacity, pulsing, or other properties discussed herein. In some example implementations, pulsing may be or include a series of pulses as opposed to a recurring frequency or occurrence of pulses such as a recognizable pattern. The front-end system may also be configured to receive a user preference for features of interest (e.g., frequency, frequency band, and the like) of a physical field to be rendered within the display. As such, the emissions may be displayed and/or rendered as objects having physical characteristics being determined by the features of interest defined by the user. In one example, during display, the defined features of interest may increase in intensity as they reoccur. Similarly, the execution system may be configured to receive a user preference to omit features of the physical field from being rendered within the display.

In some example implementations, the fields include at least two interfering (e.g., collision, anomaly, and the like) fields. In such an implementation, the energy spectrum visualization system 110 may be configured to generate a multidimensional visualization layout from which the interference between the at least two fields is identifiable.

As discussed herein, computing architecture visualization may be implemented via an augmented reality system (e.g., environmental visualization system 200) that enables a user to physically visualize invisible computing signals representing data as the signals traverse across and among a communication network including computing systems, networks, and devices. Accordingly, the front-end system 102 may integrate multiple visual and interactive troubleshooting processes thereby providing a more intuitive representation of information flowing throughout the communication network, and reducing cognitive workload for the user which in return may reduce the occurrence of troubleshooting errors and promote a better understanding of the problem at hand.

As explained in greater detail below, the front-end system 102 may be generally configured to receive signals communicated between source and destination network nodes. The source and destination network nodes may be in a communication network composed of a plurality of network nodes within an environment of a user in which the source and destination nodes are separate and distinct from the front-end system. The signals may carry messages between the source, intermediate and destination network nodes. The front-end system may also be generally configured to interpret the messages to identify the source and destination network nodes, and generate data input for the signals that indicates the source and destination network nodes. In some example implementations, receiving the signals may further comprise categorizing the signals to enable the system to more easily and expeditiously interpret of the messages. Accordingly, message may be decoded and/or interpreted in real-time or during pre-recorded playback of received transmissions.

In some example implementations, the front-end system 102 may be configured to receive the signals from a source network node or a destination network node as they are being communicated between the source, an intermediate point and/or destination. In at least one instance the signals may be communicated between the source and destination network nodes over a wired or physical medium (e.g., copper wire, optical fiber, coaxial cable, and the like) or in the form of wireless transmission or electromagnetic wave.

The computing architecture system 112 may be coupled to the front-end system 102 and generally configured to generate from the data input, a multidimensional layout that depicts the communication network. Accordingly, the multidimensional layout may include the source and destination network nodes and signals communicated between the source and destination network nodes. The front-end system 102 may then output the multidimensional layout for display by a display device 110. Accordingly, the display device may enable physical projection of a computing architecture onto a map, diagram, schematic, and/or within the environment of a user in real-time or asynchronously. The projection may provide a first person view of signal traversal through or across the communication network. The multidimensional layout may be overlaid on at least one (but potentially more than one, simultaneously) of the following including, but not limited to directly within the users field of view, a two dimensional representation (e.g., engineering drawing, map, and the like), a three dimensional representation (e.g., a to-scale model), a four dimensional representation including time (e.g., the last twenty Fridays at this time)

In some example implementations, the signals include two or more characteristics. In such an implementation, the computing architecture system 112 may be configured to generate a multidimensional layout that simultaneously depicts the two or more characteristics in which each of the two or more characteristics is represented using the distinct visual, tactile or audible property. Accordingly, a user may visually differentiate, amongst multiple signal characteristics by transforming the characteristics associated with the signals into a variety of objects in a visual field. The representative objects may differentiate characteristics in a number of ways including, but not limited to different colors, color intensity, patterns, opacity or transparency, pulsing of the object, size of the object, movement of the object, location of signals, trajectory of signals, duration of signals, intensity and/or strength of signals, consistency of signals, destination of signals, and the like.

This feature may enable a user to visualize information at a conceptual level (e.g., objects with shape, color, texture, opacity, frequency of pulsing, and the like) as opposed to electrical frequency until the user identifies specific areas of interest (e.g., an anomaly) such that the user may select those representations (e.g., audio/visual/tactile), pause the representations (e.g., stop the streaming of information while still recording) and examine details of the selected information object or objects (e.g., view envelope and payload details of a TCP/IP packet based on the selected object(s), or examine the emitted frequencies emitted by a computing, storage or transmission device, apply appropriate algorithms for the purpose of decoding a transmission, and the like)

In such an implementation, the front-end system 102 may be configured to receive a user preference for the distinct visual, tactile or audible property used to represent each of the two or more different types of characteristics. The two or more characteristics may include at least two of a signal characteristic (e.g., raw wave forms), transmission characteristic (e.g., data packet information), or content (e.g., payload content, actual message) associated with the signals communicated between the source and destination network nodes.

The front-end system 102 may also be configured to receive a user preference for characteristics of interest (e.g., signal characteristic, transmission characteristics, and the like) of a signal to be rendered within the display. As such, the signals may be displayed and/or rendered as objects having physical characteristics being determined by the characteristics of interest defined by the user. Similarly, the front-end system may be configured to receive a user preference to omit characteristics of the signal from being rendered within the display.

In some example implementations, the front-end system 102 may be configured to receive a user input setting a trigger to detect a particular event and/or signal, and thereby capture the event upon detection of the trigger. The front-end system may also trigger a workflow of the detected event based on the characteristics of the event. The front-end system may further enable tagging for characteristics of interest to be traced throughout the communication network.

In some example implementations, the computing architecture system 112 may be configured to generate a multidimensional layout including a depiction of the communication network that indicates a distribution of the network nodes including the source and destination network nodes. In some example implementations, the distribution may be a spatial or functional distribution.

In some example implementations, the energy spectrum system 110 may generate a first multidimensional layout that depicts the at least one energy frequency and spatial-temporal distribution of the emissions from which a significance of the emissions is identifiable, and the computing architecture system 112 may generate a second multidimensional layout that depicts the communication network, including the source and destination network nodes and signals communicated therebetween. In such an implementation, the front-end system 102 may be configured to receive the first and second multidimensional layouts and product from the first and second multidimensional layouts a combined multidimensional layout that simultaneously depicts the communication network and the at least one energy frequency and spatial-temporal distribution of the emissions, and outputting the combined multidimensional layout. The combined multidimensional layout may then be output by the front-end system for display by a display device.

In some example implementations, the display device 110 may be configured to generate and/or enable a live or direct view of the environment, augmented by the multidimensional layout. The multidimensional layout may be overlaid on at least one (but potentially more than one, simultaneously) of the following including, but not limited to, directly within the users field of view, a two dimensional representation (e.g., engineering drawing, map, and the like), or a three dimensional representation (e.g., a to-scale model).

In some example implementations, the front-end system 102 may be configured to record in real-time the input (e.g., sensed input, data input, and the like) from which the multidimensional layout is generated and thereby produce a recorded input, and from the recording input generate a recorded multidimensional layout in which the recorded multidimensional layout may be output for display by the display device 110 to enable playback (e.g., pause, slow motion, fast forward, reverse and the like) of the multidimensional layout in real-time or over a predetermined period of time as defined by the user. As such, this may enable slowing down in real-time or pausing a real-time display to both interact as the information occurs as well as to go back and visualize what was previously displayed. Additionally, the user may be enabled to view the presented sensed signals from different perspectives (both from changing the viewing angle within the environment as well as the form rendered— e.g., look from the emissions visualized directly in the environment to the engineering drawing on paper or on a tablet computer, for example).

The front-end system 102 may record underlying signals and optionally the user interaction within the environment. In some implementations multiple instances of recorded multidimensional layouts may be replayed simultaneously such that a user is able to visualize discrepancies across different snapshots of time. Playback may occur over a predetermined period of time, but may often be utilized to pause in real-time and/or rewind to examine signals recently detected in more detail which, in some instance may likely strip and/or remove the display of other signals from the presentation modalities. Playback may occur for prior recorded signals that have received seconds, minutes, hours, weeks, and/or years in the past.

Prior signals may be simultaneously played back while viewing currently sensed signals. The playback may include multiple recordings (e.g., replay yesterday at a specific period of time, or replay every Monday for the last three weeks at a specific period of time) along with the currently sensed signals being displayed—or in absence of the currently sensed signals being displayed. As such, individual signals may be further selected for examination or to be suppressed from the playback interface.

In such an implementation, the display device 110 may be configured to generate or enable a direct view of the environment, augmented by the recorded multidimensional layout. As such, the user may be enabled to visualize the multidimensional layout in a three dimensional (3D) spaces to better understand the nature of the signals (e.g., radiant emissions). For example, a user may have the ability to walk around a given recorded instance being physically indexed to the location that the recording was initially captures. In an alternative implementation, a recorded multidimensional layout may be presented independent of the indexed environment such that a user is able to view the originally captured multidimensional layout from different aspects.

In some example implementations, the front-end system 102 may enable a user to physically select a signal and/or physical field via gesture (e.g., tap and zoom) to view details of the data associated with the signal and/or physical field.

In some example implementations, the front-end system 102 may be configured to output the multidimensional layout for display by a plurality of display devices of a respective plurality of users. For example, a multidimensional layout can be simultaneously reviewed by multiple users at remote locations from the same vantage point, or from separate, independent and disparate vantage points.

The environmental visualization system 100 and methods of example implementations may find use in a variety of potential applications, such as in the context of a complex system such as an aircraft or any of a number of other structures. One example of a suitable application is the support of engineering activities such as those performed during pre-production, production or post-production of a complex system such as an aircraft. Another example of a suitable application is the support of tasks such as pre-production, production or post-production tasks performed on components of a complex system. Examples are described below in the context of the implementation of the system shown and described with reference to FIG. 2, namely, in the form of the system 200. It should be understood, however, that the scenarios are equally applicable to other more general or more specific implementations of the system, including those with other types of personal display systems.

Figure 3:
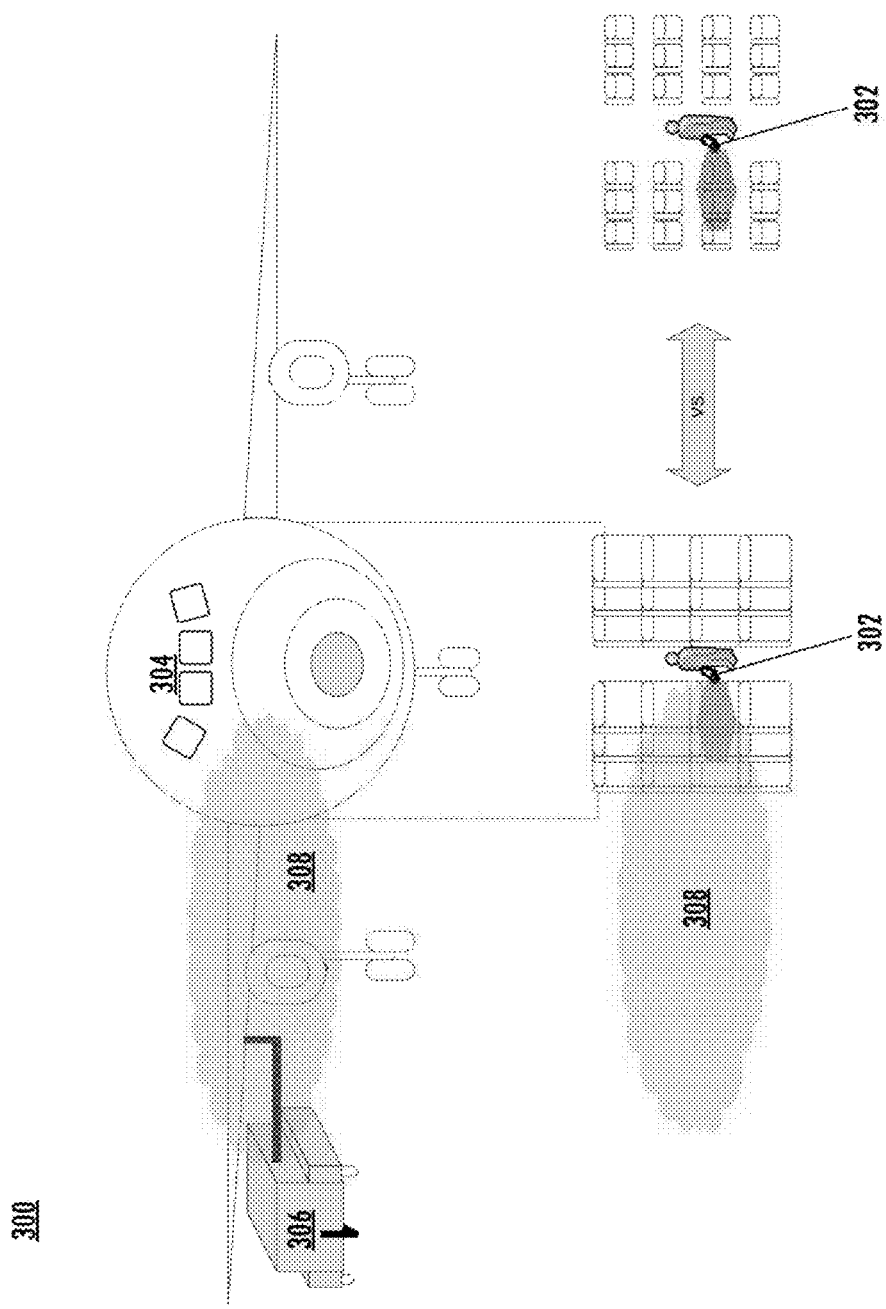
FIGS. 3-10 illustrate visualizations rendered by the environmental visualization system, in accordance with an example implementation.

In one example implementation, the environmental visualization system 100, and more particularly the front-end system 102 and energy spectrum system 110, may be utilized to identify frequency interferences. For example, as illustrated in FIG. 3, in a factory environment 300 or on a flight line during commercial aircraft manufacture, information gathering devices 302 for measuring and/or acquiring part information over a radio frequency spectrum may be utilized. Examples of suitable information gathering devices may include RFID readers/writers. For example, the RFID reader may be configured to gather information from serialized parts of an aircraft. In instances in which an assembled airplane 304 is powered via power generated by a source 306 other than the engine (e.g., a ground power unit (GPU), or other auxiliary power unit (APU)), a potential exists for the occurrence of noise 308 with associated the external power source (e.g., motor-generator sets) of such systems. The external power source may inject frequencies outside of the power generation frequencies (e.g., 60 Hz, 400 Hz, and the like). When such external electrical (e.g., power bus) and electromagnetic noise is introduced into the environment, the interference may degrade or inhibit operations of equipment designed for manufacture, maintenance, and the like. The front-end system may be utilized to identify such interferences by providing visualization of energy spectrum components present in the areas of operation, and by providing quick and meaningful insight to equipment operators.

Figure 4:
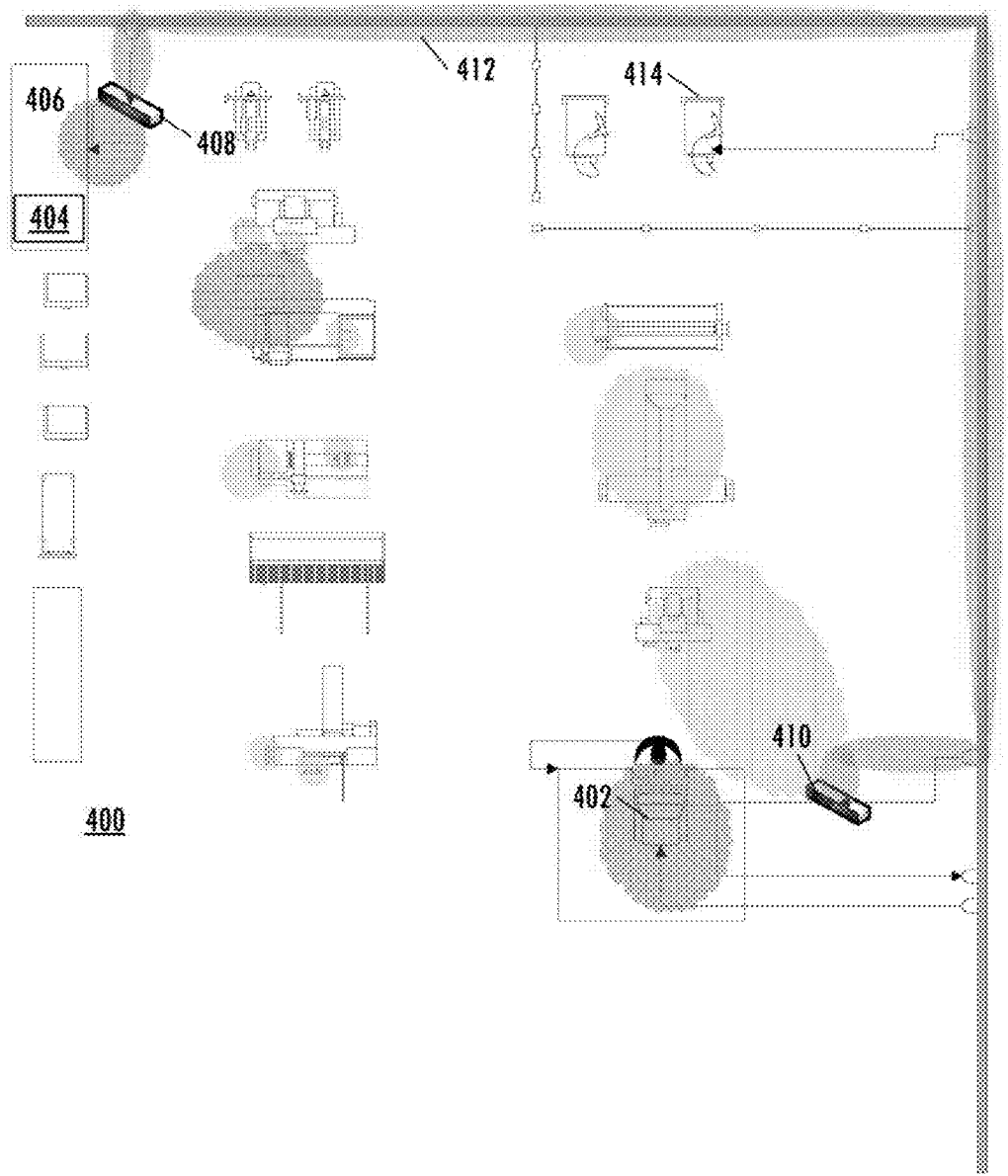
Figure 5:
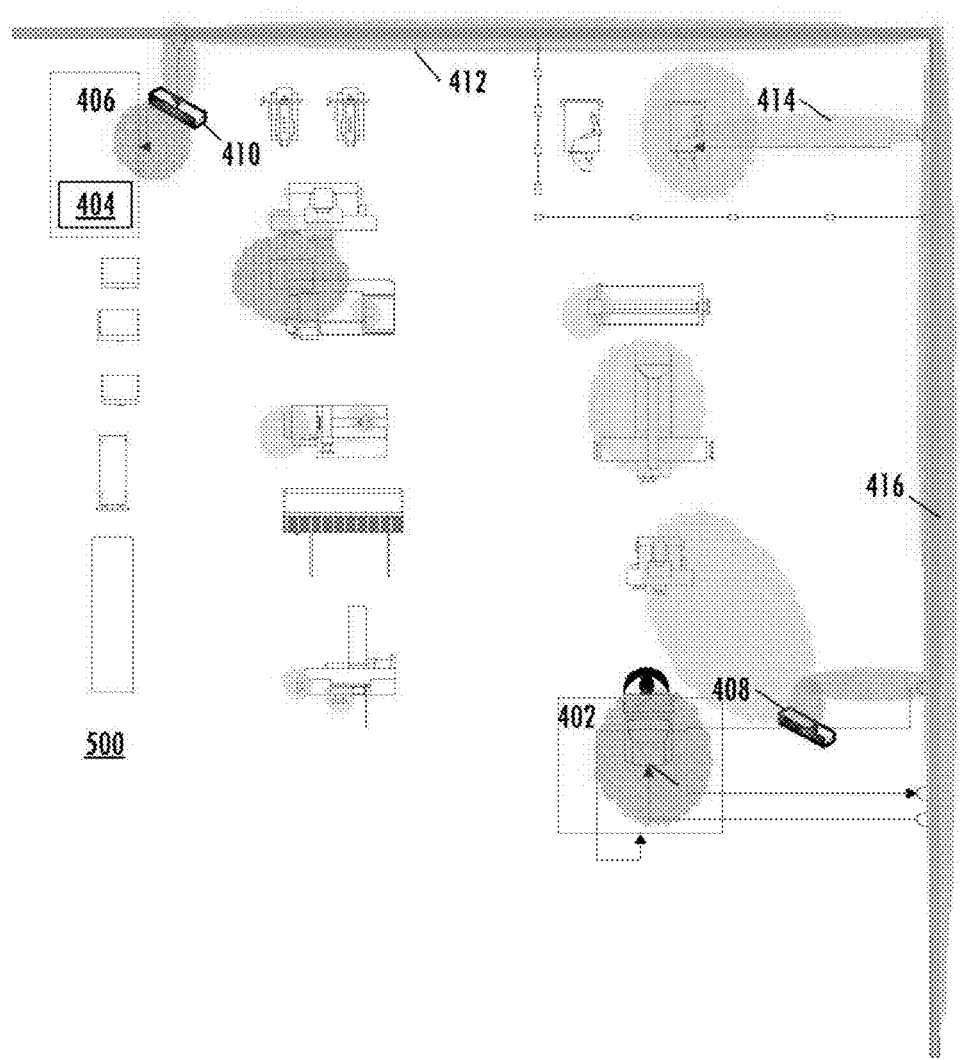

As illustrated in FIGS. 4 and 5, in another example implementation, the environmental visualization system 100, and more particularly the front-end system 102 and energy spectrum system 110, may be utilized to identify frequency interferences in the context of factory operations. For example, a computer 402 may be utilized to perform end-of-line functional test on a microcontroller 404 used in a manufactured industrial product 406. Communication between the computer and microcontroller may occur via power line modems 408, 410 superimposing high frequency signals 412 on a building power system's carrier frequency (60 Hz). As shown in FIG. 4 for a factory environment 400, the communication may function as expected during normal operations. However, as illustrated in FIG. 5, sporadic use of electrically noisy equipment 414 (e.g., TIG welders) within a factory environment 500 may introduce high frequency signals 416 on the building's power lines. Typically having little to no impact on 60 Hz equipment, specialized power line modems 408, 410 may be highly sensitive to signals in their spectrum of operation. The front-end system may be utilized to provide a visual display of the interference to enable an operator to visualize a correlation related to the problem thereby resulting in a rapid analysis of the root cause of the related issue.

In another example implementation, the environmental visualization system 100, and more particularly the front-end system 102 including the front-end system and networking engine, may be utilized in conjunction to identify interferences and assist in rapid problem resolution for software and/or network related problems. For example, upon inspection of the energy spectrum "noise", emissions may be detected as interfering with communication and/or having a negative effect on the performance of a computing system. This determination may be based on various factors including but not limited to frequency, rate, and brute force decoding approaches. In some examples, interferences may be associated with intentional power line communication, and in other examples power line communication may be unintentional—either through tacitly embedded systems or by leveraging power lines as a basic antenna.

Figure 6:
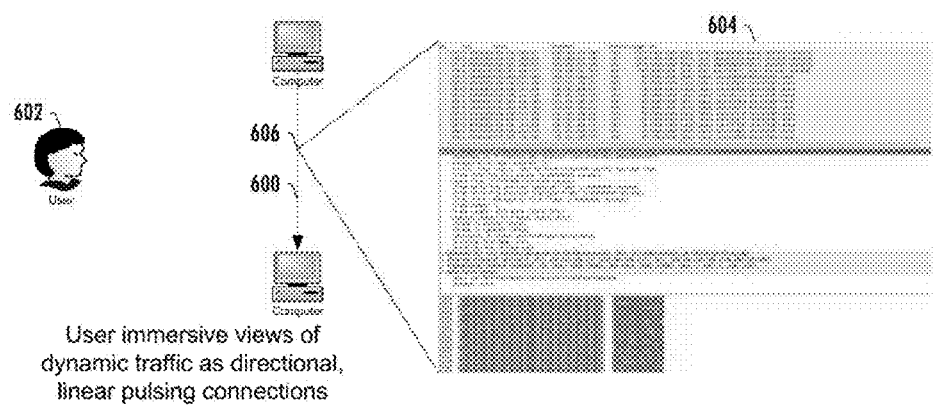

In one example implementation, the environmental visualization system 100, and more particularly the front-end system 102 computing architecture system 112, may be utilized for debugging networked computing applications. For example, the front-end system may enable debugging task (e.g., generating text documents representative of data packets captured based on protocol, port and other filter patterns applied, deciphering filtered results, correlating results with the device(s) applications based on IP tables, port and protocol associations, and the like) to be relegated to computational processes and visually displayed as a virtual connection between physical devices using an overlay visualization apparatus (e.g., projector, head mount display, and the like). User interaction with relation to the virtual connection may be detected and correlated to action specific tasks. For example, as illustrated in FIG. 6, a user 602 may physically "touch" the virtual connection stream 600 such that the front-end system invokes a display 604 for the underlying packet information being filtered based on preference and user selection and/or communication between one or more nodes of the intermediate path if known. The virtual connection stream 600 may represent communication between one or more source and destination nodes, and an associated intermediate path, if known.

Figure 7:
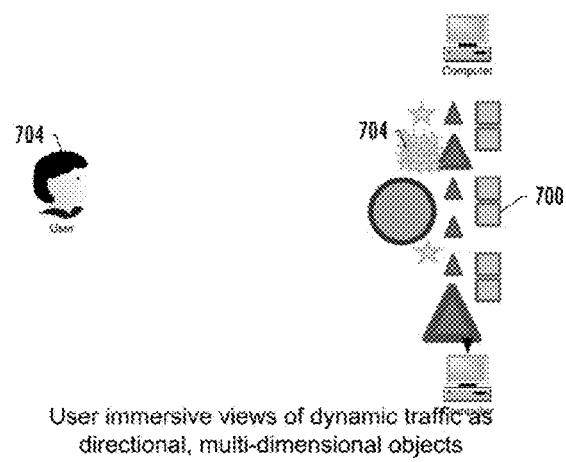

In an alternative example, as illustrated in FIG. 7, informational representation for the virtual connection 700 includes the use of three dimensional (3D) shapes 702. The size of the shapes, speed of traversal between source and destination nodes, color, hue, opacity, intensity, persistence (e.g., solid to rapid flashing), and the like may be correlated to information-specific attributes. In some implementations, for example, the user 704 may select to correlate data packet payload size to object size, color to computing device (e.g., a color associated with an internet protocol (IP) address), and shape to represent a protocol-port combination. In an alternative example, the object shape may represent a computing device, the object color may represent port, and the object rotation may represent a protocol.

Figure 8:
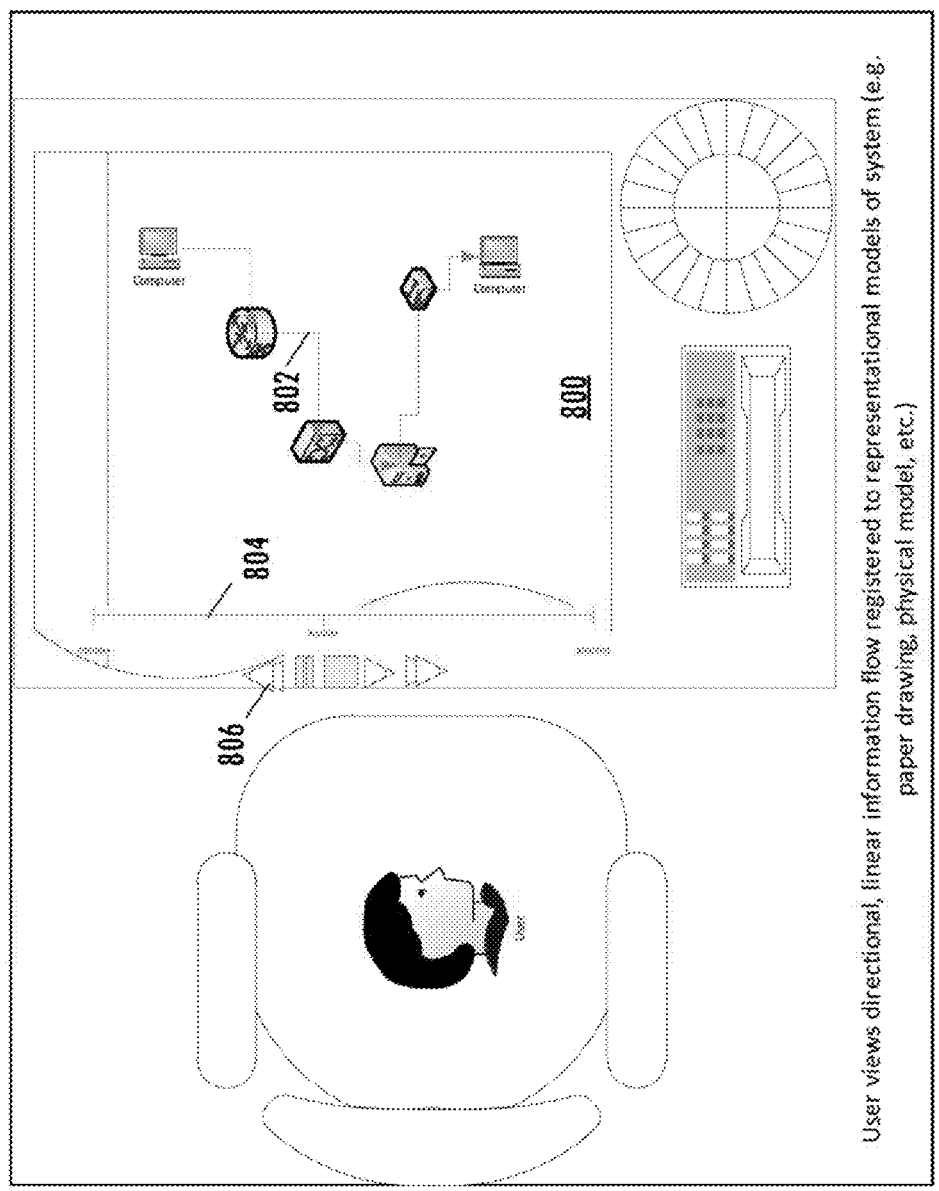

It should be noted that a physical existence of a computing device is not necessary for the interactive display. For example, as illustrated in FIG. 8, printed schematics 800 of physical systems (e.g., using correlated cues such as markers, image recognition, text recognition, and the like) may be registered to display the physical interactions 802. The system may be configured to provide a scrollable virtual timeline 804 for controlling playback of an interactive display in which one or more playback controls 806 may also be provided.

Figure 9:
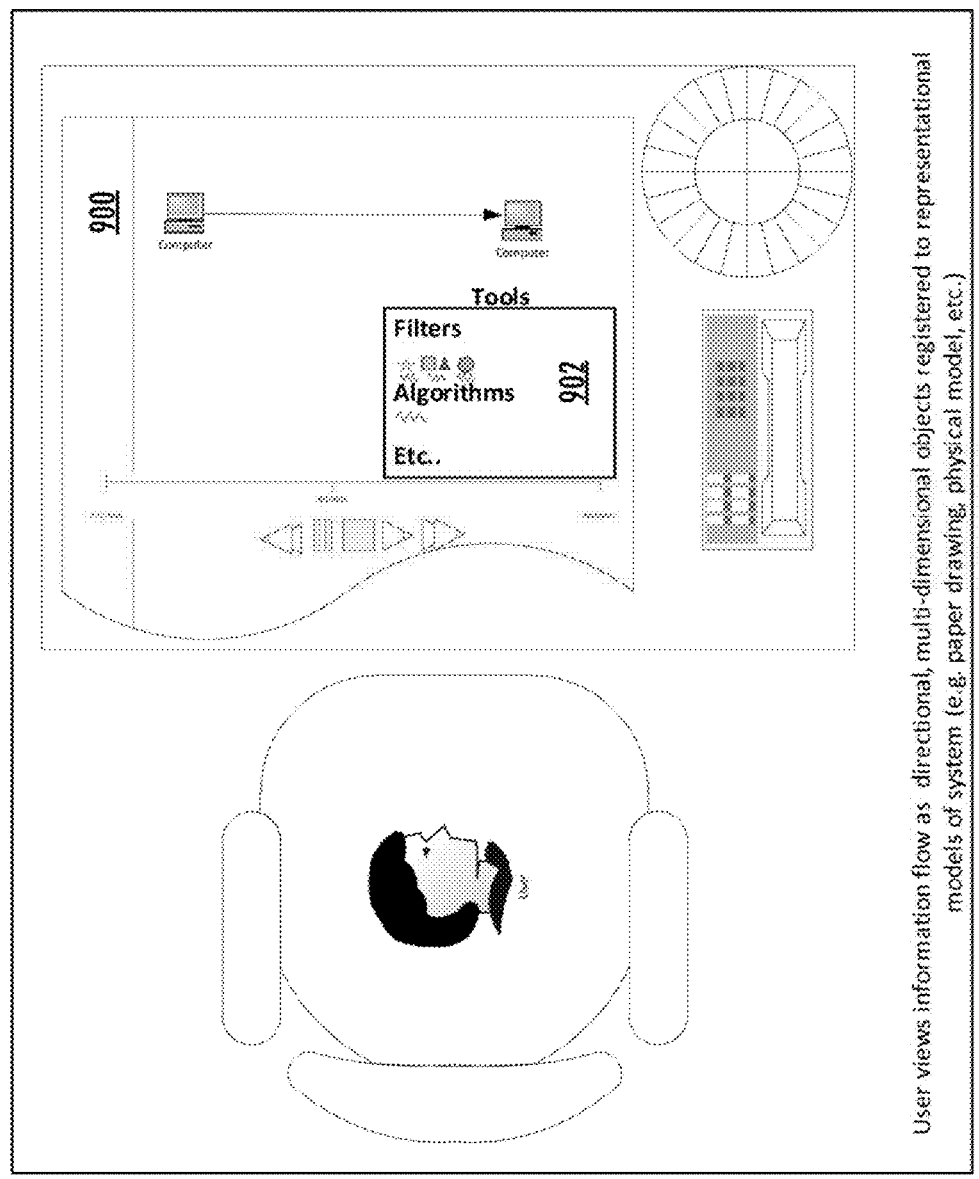
Figure 10:
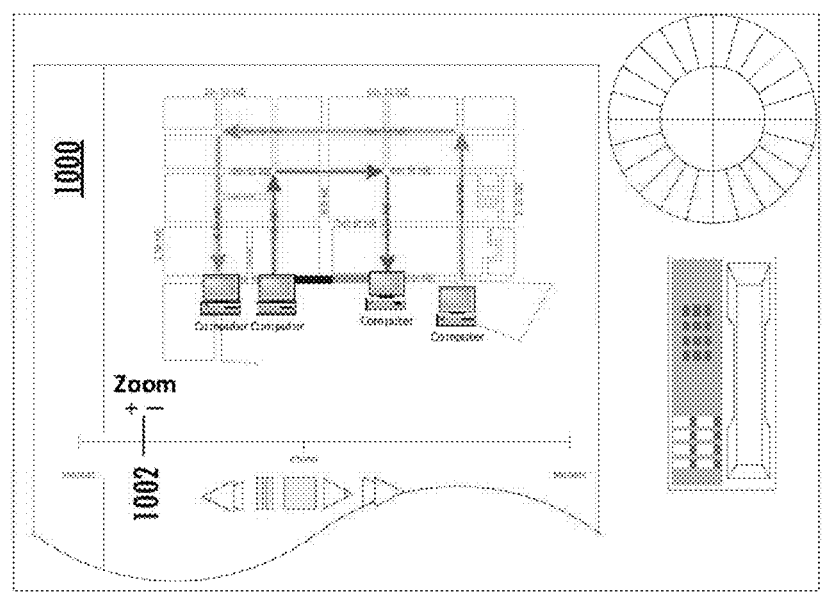
Figure 10:
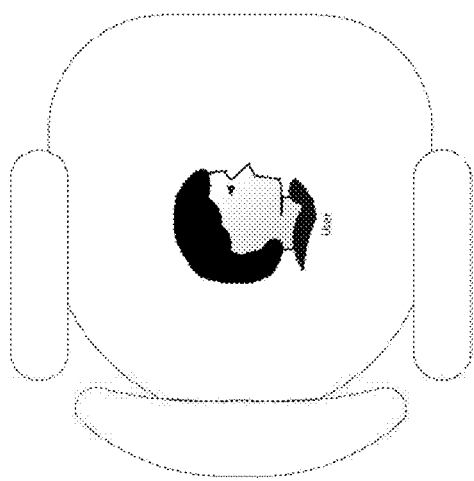

In one example implementation, as illustrated in FIG. 9, the front-end system 102 may enable either playback or real time connection information represented by directional, linear flow information within a schematic 900 (e.g., engineering drawing) in which the dwell of flow may be configurable. For example, the dwell of flow may be set to gradually diminish in intensity (similar to an oscilloscope) over a period of time. In one implementation, the dwell of flow may diminish to no more than fifty percent (50%) of the frequency of the signal. The user may also be presented a virtual menu 902 for configuring the display and/or analysis features. In another example implementation, as illustrated in FIG. 10, other representations such as a geographical representation 1000 (e.g., map, globe, miniature/model representation, and the like) may be utilized for visualization of a respective computing architecture. The system may also be configured to provide a virtual zoom feature 1002 for controlling the projected multidimensional output.

Figure 11:
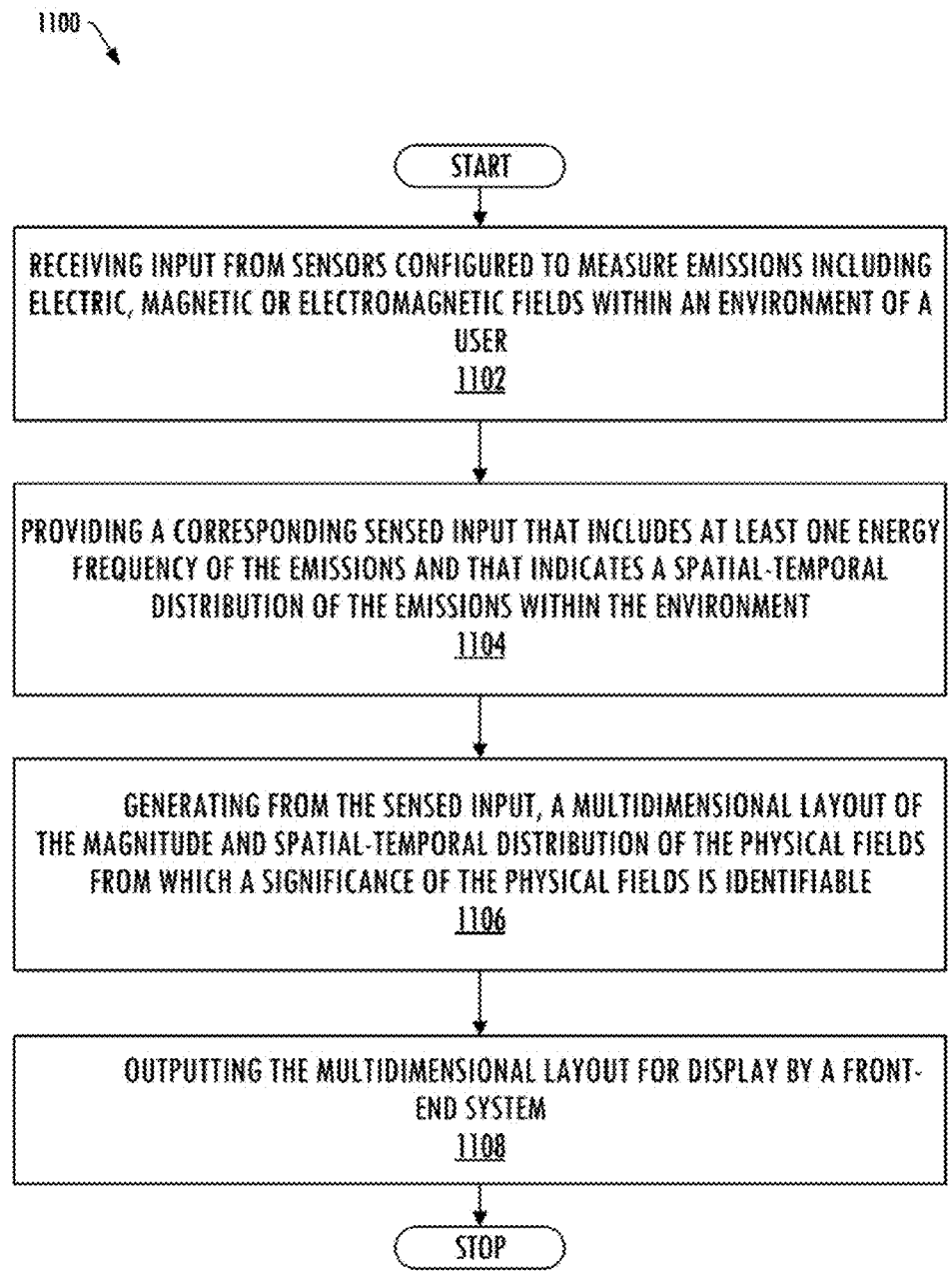
FIG. 11 is a flow diagram illustrating various operations of a method of maintenance of visualization of an energy spectrum, in accordance with an example implementation.

FIG. 11 illustrates a flowchart including various operations of a method 1100 for visualization of an energy spectrum, in accordance with an example implementation of the present disclosure. As shown at block 1102, the method may include receiving input from sensors configured to measure emissions including electric, magnetic or electromagnetic fields within an environment of a user. The method may include providing a corresponding sensed input that includes at least one energy frequency of the emissions and that indicates a spatial distribution of the emissions within the environment, as shown in block 1104. The method may also include generating from the sensed input, a multidimensional layout of the at least one energy frequency and spatial distribution of the emissions from which a significance of the emissions is identifiable, as shown at block 1106. The method may also include outputting the multidimensional layout for display by a front-end system, as shown in block 1108.

Figure 12:
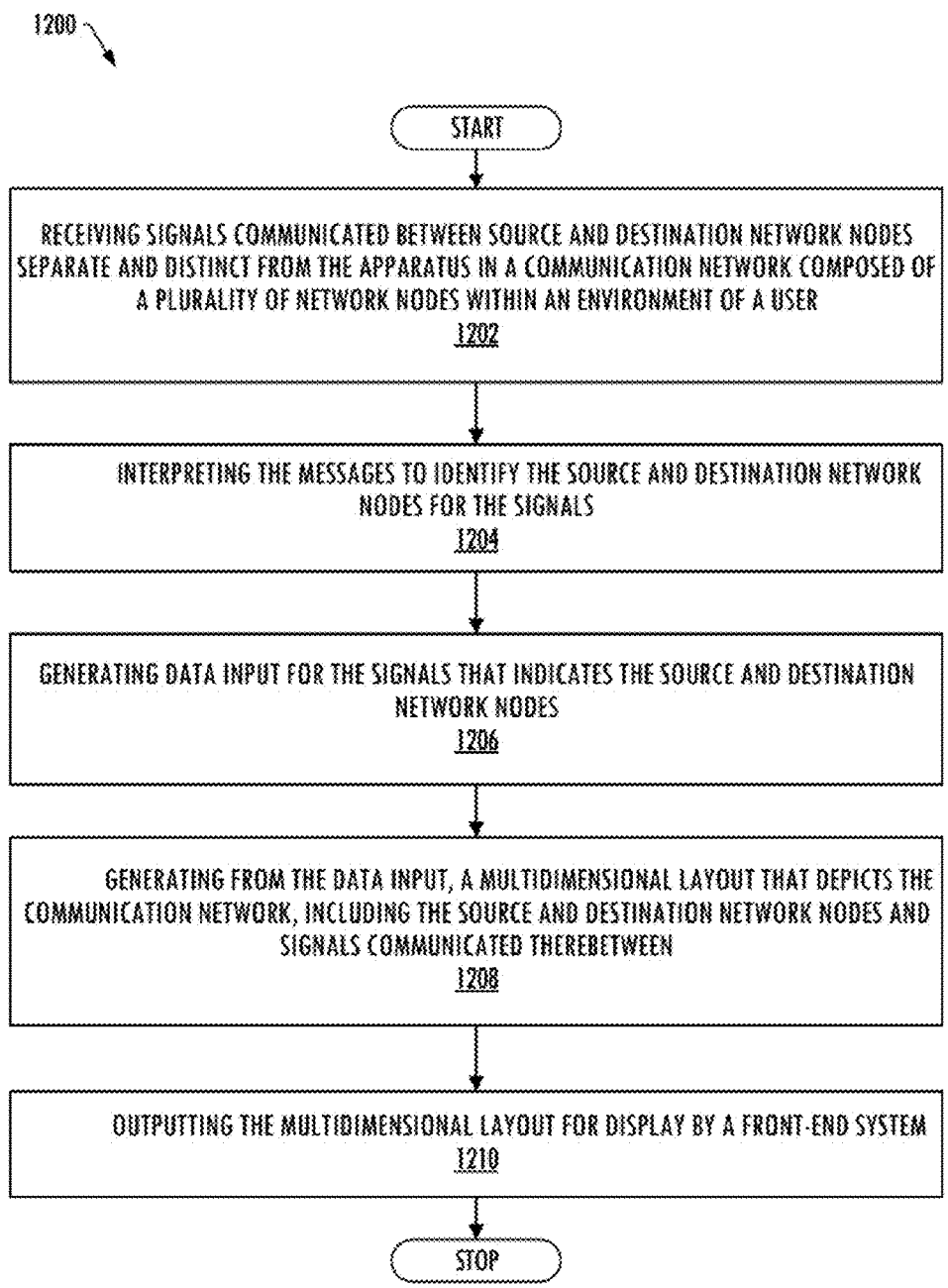
FIG. 12 is a flow diagram illustrating various operations of a method of maintenance of visualization of a computing architecture, in accordance with an example implementation.

FIG. 12 illustrates a flowchart including various operations of a method 1200 for implementation of a front-end system for visualization of a computing architecture, in accordance with an example implementation of the present disclosure. As shown at block 1202, the method may include receiving signals communicated between source and destination network nodes separate and distinct from the apparatus in a communication network composed of a plurality of network nodes within an environment of a user in which the signals carry messages between the source and destination network nodes. The method may include interpreting the messages to identify the source and destination network nodes for the signals, as shown at block 1204. The method may include generating data input for the signals that indicates the source and destination network nodes, as shown in block 1206. The method may also include generating generate from the data input, a multidimensional layout that depicts the communication network, including the source and destination network nodes and signals communicated therebetween, as shown at block 1208. The method may also include outputting the multidimensional layout for display by a front-end system, as shown in block 1210.

According to example implementations of the present disclosure, the environmental visualization system 100 and resource host systems (e.g., energy spectrum system 110, computing architecture system 112), and their respective subsystems may be implemented by various means. Similarly, the example system 200, including each of its respective subsystems, elements and the like, may be implemented by various means according to example implementations. Means for implementing the systems, subsystems and their respective elements may include hardware, alone or under direction of one or more computer programs from a computer-readable storage medium.

In some examples, one or more apparatuses may be provided that are configured to function as or otherwise implement the systems, subsystems, tools and respective elements shown and described herein. In examples involving more than one apparatus, the respective apparatuses may be connected to or otherwise in communication with one another in a number of different manners, such as directly or indirectly via a wired or wireless network or the like.

Figure 13:
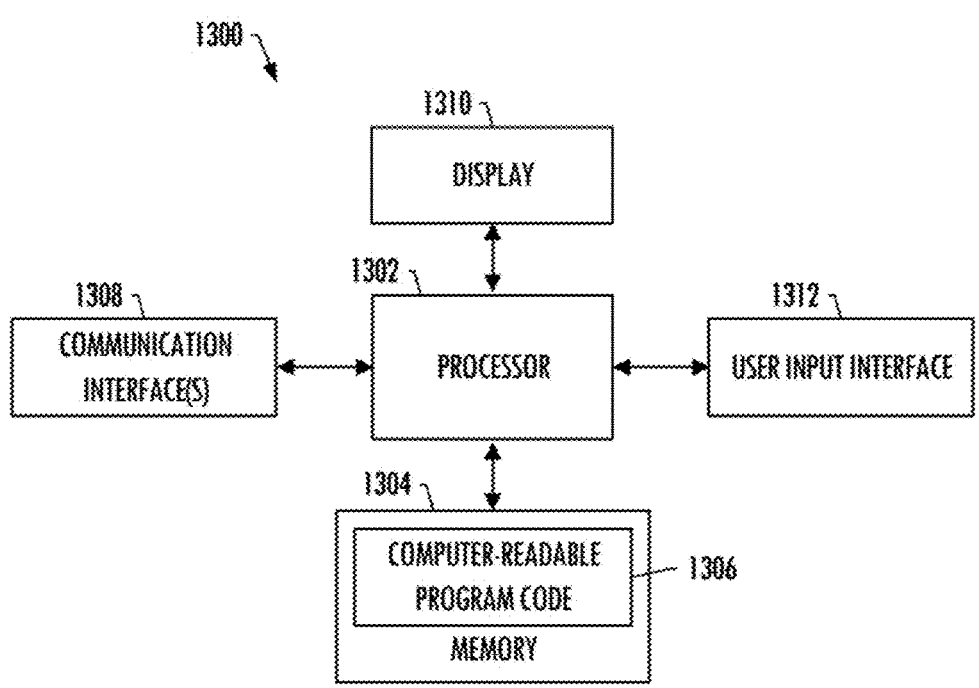
FIG. 13 illustrates an apparatus according to some example implementations.

FIG. 13 illustrates an apparatus 1300 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 1302 (e.g., processor unit) connected to a memory 1304 (e.g., storage device).

The processor 1302 is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 1304 (of the same or another apparatus).

The processor 1302 may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory 1304 is generally any piece of computer hardware that is capable of storing information such as, for example, data, computer programs (e.g., computer-readable program code 1306) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include one or more communication interfaces 1308 (e.g., communications interfaces 104), sensors 106 (e.g., sensors 206-220) and/or user input interfaces 1312, examples of which are described above with reference to communications interface 104, sensor 106 and/or user interface (including display device 108—e.g., display device 224).

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 1300 may include a processor 1302 and a computer-readable storage medium or memory 1304 coupled to the processor, where the processor is configured to execute computer-readable program code 1306 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An environmental visualization system comprising:
   a front-end system configured to receive input from sensors configured to measure emissions including electric, magnetic or electromagnetic fields within an environment of a user, the front-end system being configured to provide a corresponding sensed input that includes at least one energy frequency of the emissions and that indicates a spatial-temporal distribution of the emissions within the environment; and
   an energy spectrum system coupled to the front-end system and configured to generate from the sensed input, a multidimensional layout that depicts the at least one energy frequency and spatial-temporal distribution of the emissions from which a significance of the emissions is identifiable,
   wherein the front-end system is configured to receive and output the multidimensional layout for display by a display device,
   wherein the front-end system is further configured to receive signals communicated and carrying messages between source and destination network nodes separate and distinct from the environmental visualization system in a communication network composed of a plurality of network nodes within the environment of the user, and generate data input for the signals that indicates the source and destination network nodes,
   wherein the environmental visualization system further comprises a computing architecture system configured to generate from the data input, a second multidimensional layout that depicts the communication network, including the source and destination network nodes and signals communicated therebetween, and
   wherein the front-end system being configured to receive the multidimensional layout includes being configured to further receive the second multidimensional layout, and the front-end system being configured to output the multidimensional layout includes being configured to produce from the multidimensional layout and second multidimensional layout, a combined multidimensional layout that depicts the communication network and the at least one energy frequency and spatial distribution of the emissions, and output the combined multidimensional layout.

2. The environmental visualization system of claim 1, wherein the fields include one or more different types of fields selected from electric, magnetic or electromagnetic fields, and
    wherein the energy spectrum system being configured to generate the multidimensional layout includes being configured to generate the multidimensional layout that includes the one or more different types of fields, and in which each of the one or more different types of fields is represented using at least one of a distinct visual, tactile or audible property, the distinct visual, tactile or audible property including at least one of a color, shape, size, opacity, speed, direction or pulsing.

3. The environmental visualization system of claim 1, wherein the front-end system being configured to output the multidimensional layout for display by a display device includes the display device being configured to generate or enable a live or direct view of the environment, augmented by the multidimensional layout.

4. The environmental visualization system of claim 1, wherein the front-end system being configured to receive the multidimensional layout includes being configured to record in real-time the sensed input from which the multidimensional layout is generated and thereby produce a recorded sensed input, and generate from the recorded sensed input, a recorded multidimensional layout,
    and the front-end system being configured to output the multidimensional layout includes being configured to output the recorded multidimensional layout for display by the display device to enable playback of the multidimensional layout in real-time or over a predetermined period of time.

5. The environmental visualization system of claim 4, wherein the front-end system being configured to output the recorded multidimensional layout includes the display device being configured to generate or enable a direct view of the environment, augmented by the recorded multidimensional layout.

6. The environmental visualization system of claim 2, wherein the energy spectrum system being configured to generate the multidimensional layout includes being configured to receive a user preference for the distinct visual, tactile or audible property used to represent each of the one or more different types of fields.

7. A method for visualization of an energy spectrum, the method comprising at an environmental visualization system:
    receiving input from sensors configured to measure emissions including electric, magnetic or electromagnetic fields within an environment of a user;
    providing a corresponding sensed input that includes at least one energy frequency of the emissions and that indicates a spatial-temporal distribution of the emissions within the environment;
    generating from the sensed input, a multidimensional layout that depicts the at least one energy frequency and spatial-temporal distribution of the emissions from which a significance of the emissions is identifiable; and
    receiving and outputting the multidimensional layout for display by a display device,
    wherein the method further comprises:
    receiving signals communicated and carrying messages between source and destination network nodes separate and distinct from the environmental visualization system in a communication network composed of a plurality of network nodes within the environment of the user;
    generating data input for the signals that indicates the source and destination network nodes; and
    generating from the data input, a second multidimensional layout that depicts the communication network, including the source and destination network nodes and signals communicated therebetween,
    wherein receiving the multidimensional layout includes further receiving the second multidimensional layout, and wherein outputting the multidimensional layout includes producing from the multidimensional layout and the second multidimensional layout, a combined multidimensional layout that depicts the communication network and the at least one energy frequency and spatial distribution of the emissions, and outputting the combined multidimensional layout.

8. The method of claim 7, wherein the fields include one or more different types of fields selected from electric, magnetic or electromagnetic fields, and
    wherein generating the multidimensional layout includes generating the multidimensional layout that includes the one or more different types of fields, and in which each of the one or more different types of fields is represented using at least one of a distinct visual, tactile or audible property, the distinct visual, tactile or audible property including at least one of a color, shape, size, opacity, speed, direction or pulsing.

9. The method of claim 7, wherein outputting the multidimensional layout for display by a display device includes generating or enabling a live or direct view of the environment, augmented by the multidimensional layout.

10. The method of claim 7, wherein receiving the multidimensional layout includes recording in real-time the sensed input from which the multidimensional layout is generated and thereby producing a recorded sensed input, and generating from the recorded sensed input, a recorded multidimensional layout,
    and wherein outputting the multidimensional layout includes outputting the recorded multidimensional layout for display by the display device to enable playback of the multidimensional layout in real-time or over a predetermined period of time.

11. The method of claim 10, wherein outputting the recorded multidimensional layout includes generating or enabling a direct view of the environment, augmented by the recorded multidimensional layout.

12. The method of claim 8, wherein generating the multidimensional layout includes receiving a user preference for the distinct visual, tactile or audible property used to represent each of the one or more different types of fields.

13. A computer-readable storage medium having computer-readable program code stored therein for visualization of an energy spectrum, which in response to execution by a processor, cause an apparatus to at least:

receive input from sensors configured to measure emissions including electric, magnetic or electromagnetic fields within an environment of a user;

provide a corresponding sensed input that includes at least one energy frequency of the emissions and that indicates a spatial-temporal distribution of the emissions within the environment;

generate from the sensed input, a multidimensional layout that depicts the at least one energy frequency and spatial-temporal distribution of the emissions from which a significance of the emissions is identifiable; and receive and output the multidimensional layout for display by a display device, wherein the apparatus is further caused to:

receive signals communicated and carrying messages between source and destination network nodes separate and distinct from the apparatus in a communication network composed of a plurality of network nodes within the environment of the user;

generate data input for the signals that indicates the source and destination network nodes; and generate from the data input, a second multidimensional layout that depicts the communication network, including the source and destination network nodes and signals communicated therebetween, wherein the apparatus being caused to receive the multidimensional layout includes being caused to further receive the second multidimensional layout, and the apparatus being caused to output the multidimensional layout includes being caused to produce from the multidimensional layout and the second multidimensional layout, a combined multidimensional layout that depicts the communication network and the at least one energy frequency and spatial distribution of the emissions, and output the combined multidimensional layout.

14. The computer-readable storage medium of claim 13, wherein the fields include one or more different types of fields selected from electric, magnetic or electromagnetic fields, and wherein the apparatus being caused to generate the multidimensional layout includes being caused to generate the multidimensional layout that includes the one or more different types of fields, and in which each of the one or more different types of fields is represented using at least one of a distinct visual, tactile or audible property, the distinct visual, tactile or audible property including at least one of a color, shape, size, opacity, speed, direction or pulsing.

15. The computer-readable storage medium of claim 13, wherein the apparatus being caused to output the multidimensional layout for display by a display device includes being caused to generate or enable a live or direct view of the environment, augmented by the multidimensional layout.

16. The computer-readable storage medium of claim 13, wherein the apparatus being caused to receive the multidimensional layout includes being caused to record in real-time the sensed input from which the multidimensional layout is generated and thereby produce a recorded sensed input, and generate from the recorded sensed input, a recorded multidimensional layout, and the apparatus being caused to output the multidimensional layout includes being caused to output the recorded multidimensional layout for display by the display device to enable playback of the multidimensional layout in real-time or over a predetermined period of time.

17. The computer-readable storage medium of claim 16, wherein the apparatus being caused to output the recorded multidimensional layout includes being caused to generate or enable a direct view of the environment, augmented by the recorded multidimensional layout.

18. The computer-readable storage medium of claim 14, wherein the apparatus being caused to generate the multidimensional layout includes being caused to receive a user preference for the distinct visual, tactile or audible property used to represent each of the one or more different types of fields.

* * * * *